(12) United States Patent
Jang

(10) Patent No.: US 12,652,772 B2
(45) Date of Patent: Jun. 9, 2026

(54) DISPLAY ASSEMBLY AND ASSEMBLY METHOD THEREOF

(71) Applicant: HYUNDAI MOBIS CO., LTD., Seoul (KR)

(72) Inventor: Kil Pyung Jang, Seoul (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 142 days.

(21) Appl. No.: 18/415,829

(22) Filed: Jan. 18, 2024

(65) Prior Publication Data

US 2024/0381557 A1    Nov. 14, 2024

(30) Foreign Application Priority Data

May 8, 2023    (KR) ......................... 10-2023-0058943

(51) Int. Cl.
H05K 5/00        (2025.01)
H05K 5/02        (2006.01)
H05K 5/03        (2006.01)
(52) U.S. Cl.
CPC ............. H05K 5/03 (2013.01); H05K 5/0217 (2013.01)

(58) Field of Classification Search
CPC .. H05K 5/03; H05K 5/0217; G02F 1/133322; G02F 1/133325; G02F 1/133314; G02F 1/133317; G02F 1/133308
See application file for complete search history.

(56) References Cited

U.S. PATENT DOCUMENTS

| | | | |
|---|---|---|---|
| 2018/0150149 A1 | 5/2018 | Li | |
| 2018/0180929 A1* | 6/2018 | Kim | ................... G02F 1/133308 |
| 2021/0200018 A1* | 7/2021 | Kim | ................... G02F 1/133325 |
| 2021/0208448 A1* | 7/2021 | Kim | ....................... H04R 1/023 |

OTHER PUBLICATIONS

European Search Report issued in corresponding European Patent Application. No. 24156476.4 dated Jul. 12, 2024.

* cited by examiner

*Primary Examiner* — Sagar Shrestha
(74) *Attorney, Agent, or Firm* — NovoTechIP International PLLC

(57)        ABSTRACT
A display assembly includes a display unit including a display, a main panel connected to a rear surface of the display unit, and a rear cover connected to a rear surface of the main panel, wherein the rear cover is fixed to the main panel in a first direction perpendicular to a surface of the display, and the rear cover is fixed to the main panel in a second direction parallel to the surface of the display.

8 Claims, 10 Drawing Sheets

1000

1300

1230

1220

1200

1100

1210

(a)                                    (b)

(a)                                                    (b)

DISPLAY ASSEMBLY AND ASSEMBLY METHOD THEREOF

CROSS-REFERENCE TO RELATED APPLICATIONS

Pursuant to 35 U.S.C. § 119(a), this application claims the benefit of earlier filing dates and right of priority to Korean Application No. 10-2023-0058943, filed on May 8, 2023, the contents of which are hereby incorporated by reference herein in their entirety.

TECHNICAL FIELD

Embodiments relates to a display assembly and an assembly method thereof, and more particularly, to a technology related to a display assembly that minimizes stress occurring due to a fixing method of a display and has improved assembly characteristics.

BACKGROUND

A display assembly may be configured by a combination of various structures such as a cover glass, a display (e.g., LCD), a display cover that covers a rear surface of a display (COVER LCD), and a metal bracket.

A display assembly according to the related art uses a bolt and nut fastening structure or a hook structure to fix a display (LCD) inside a module in place, and the position of the display is fixed by fastening the display to a metal bracket or a rear cover with screws.

However, according to the above method, the Mura phenomenon may occur after display assembly or the assembly quality of an assembly may be degraded. In the case of a hook structure, when a hook is loosely fastened, there is a high possibility of noise due to vehicle vibration and damage due to wear and tear. In the case of a defective product, scratches may appear on the exterior due to a force applied during a disassembly/reassembly process. In the case of screw fastening, stress occurs in the display to cause the Mura phenomenon due to a difference in assembly torque for each screw or a step difference for each screw assembly position.

Torsion may occur in the display assembly due to a step difference between fastening positions of screws. Torsion may affect an external or internal force that acts on the display and change color output from the display. In other words, a fixing method of the display assembly itself may cause torsion in the display and result in poor quality.

Therefore, there is a need for a display assembly and assembly method thereof that minimize this phenomenon.

SUMMARY

An object of embodiments of the present disclosure is to provide a display assembly and an assembly method thereof, which minimize external or internal forces due to fixation of a display unit.

An object of embodiments of the present disclosure is to provide a display assembly including a coupling structure that is easily applicable.

An object of embodiments of the present disclosure is to provide a display assembly and an assembly method thereof, which do not cause damage to a main body during disassembly and reassembly processes.

It will be appreciated by one of ordinary skill in the art that the objects that could be achieved with the present disclosure are not limited to what has been particularly described hereinabove and the above and other objects that the present disclosure could achieve will be more clearly understood from the following detailed description.

According to embodiments of the present disclosure, a display assembly includes a display unit including a display, a main panel connected to a rear surface of the display unit, and a rear cover connected to a rear surface of the main panel, wherein the rear cover is fixed to the main panel in a first direction perpendicular to a surface of the display, and the rear cover is fixed to the main panel in a second direction parallel to the surface of the display.

The main panel may include a first coupler, the rear cover may include a second coupler that corresponds to and is coupled to the first coupler, and the first coupler may include a first vertical protruding piece protruding in parallel to the first direction from the main panel, and a first horizontal protruding piece protruding in parallel to the second direction from an end of the first vertical protruding piece.

The second coupler may include a second vertical protruding piece protruding in parallel to the first direction from the rear cover, and a second horizontal protruding piece protruding in parallel to the second direction from an end of the second vertical protruding piece, the first horizontal protruding piece and the second horizontal protruding piece may protrude in opposite directions to each other, and when the main panel and the rear cover are coupled to each other, the rear cover may move in the second direction to engage the first horizontal protruding piece and the second horizontal protruding piece with each other.

The main panel may include a third coupler, the rear cover may include a fourth coupler that corresponds to or is coupled to the third coupler, the third coupler may have a shape that protrudes in the first direction and is symmetrical up and down based on a center line, and the third coupler may include a head and an extension extending in parallel to the second direction from the head. In addition, an edge of the head may include a circular arc, and the extension extends from both ends of the circular arc.

The fourth coupler may include an entry hole that accommodates the third coupler, and a head receiving portion that accommodates the head, spaces of the entry hole and the head receiving portion may be connected to each other, and the third coupler may be inserted into the entry hole of the fourth coupler, and may then move in parallel to the second direction to make the head be press-fit with the head receiving portion.

An inner surface of the first horizontal protruding piece may include a slope, and an inner surface of the second horizontal protruding piece may include a slope that is in contact with and corresponds to the slope of the first horizontal protruding piece.

A central angle of the circular arc of the edge of the head may be at least 180 degrees.

The main panel may include a through hole for screw coupling, and a slit formed through the main panel along a peripheral part of the hole, and the slit may be spaced a certain distance from a center of the hole.

An edge of the extension may include a slope, and an inner surface of the entry hole of the fourth coupler may include a slope corresponding to the slope of the extension.

An assembly method of a display assembly includes positioning a rear cover to be in close contact with a main panel in a direction perpendicular to a display surface, and moving the rear cover in a direction parallel to the display surface to press-fit with the main panel.

DETAILED DESCRIPTION

Figure 1:
FIG. 1 is an exploded diagram of a display assembly according to embodiments of the present disclosure.

Advantages and features of the present disclosure, and methods of achieving them may be clear with reference to the detailed description of the following embodiments taken in conjunction with the accompanying drawings. However, the present disclosure is not limited to the embodiments disclosed below, but may be implemented in various different forms, only these embodiments are intended to complete the disclosure of the present disclosure, and are common in the art to which the present disclosure belongs. It is provided to fully inform one of ordinary skill in the art of the scope of the present disclosure, and the present disclosure is only defined by the scope of the claims.

Terminology used herein is for describing the embodiments and is not intended to limit the present disclosure. In this specification, singular forms also include plural forms unless specifically stated otherwise in a phrase. As used herein, "comprises" and/or "comprising" does not exclude the presence or addition of one or more other elements other than the recited elements. Like reference numerals throughout the specification refer to like elements, and "and/or" includes each and every combination of one or more of the recited elements. Although "first", "second", etc. are used to describe various components, these components are not limited by these terms, of course. These terms are only used to distinguish one component from another. Accordingly, it goes without saying that the first element mentioned below may also be the second element within the technical spirit of the present disclosure.

Unless otherwise defined, all terms (including technical and scientific terms) used in this specification may be used with meanings commonly understood by one of ordinary skill in the art to which the present disclosure pertains. In addition, terms defined in commonly used dictionaries are not interpreted ideally or excessively unless explicitly specifically defined.

The spatially relative terms "below", "beneath", "lower", "above", "upper", etc. may be used to easily describe a component's correlation with other components. Spatially relative terms should be understood as including different orientations of elements in use or operation in addition to the orientations shown in the drawings. For example, if a component that is shown in a drawing is inverted, a component described as "below" or "beneath" another component may be placed "above" the other component. Thus, the exemplary term "below" may include directions of both below and above. Components may also be oriented in other orientations, and thus spatially relative terms may be interpreted according to orientation.

FIG. 1 is an exploded diagram of a display assembly 1000 (hereinafter, referred to as the display assembly) according to embodiments of the present disclosure.

Figure 2:
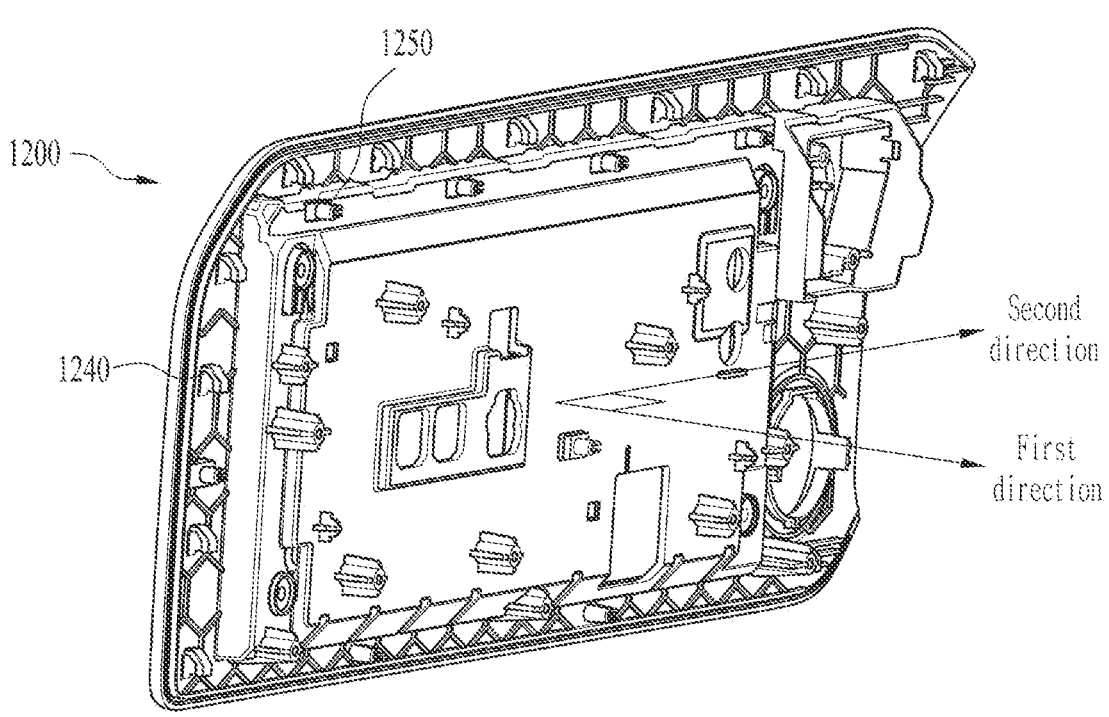
FIG. 2 is a perspective view of a main panel according to embodiments of the present disclosure.

FIG. 2 is a perspective view of a main panel 1200 of the display assembly 1000.

The display assembly may include a display unit 1100, the main panel 1200 that covers a rear surface of the display unit 1100, and a rear cover 1300 that covers a rear surface of the main panel 1200. The display unit 1100, the main panel 1200, and/or the rear cover 1300 may be assembled by screws 10. Components such as a printed circuit board (PCB) 1220 or a cable 1230 may be mounted on the main panel 1200. A dial knob 1210 may be connected to a front surface of the display unit 1100.

The display unit 1100 may represent a unit, a module, or the like, which includes a liquid crystal display (LCD) or a light emitting diode (LED). Therefore, the display unit 1100 may include a set of various detailed components related to a display liquid crystal. These detailed components may include a display cover, and a display glass, known technologies may be applied in relation to these components, and details of known technologies may be omitted in the specification.

The main panel 1200 is connected to the rear surface of the display unit 1100. The rear cover 1300 is connected to the rear surface of the main panel 1200. At this time, a method of coupling the rear cover 1300 to the main panel 1200 may be detailed as follows.

The rear cover 1300 may be fixed in contact with the main panel 1200 in a direction perpendicular to a surface of the display (first direction). At this time, in a screw coupling method, a force proportional to a torque of the screw may be applied such that the rear cover 1300 and the main panel 1200 come into close contact with each other in the first direction. The rear cover 1300 may be fixed to the main panel 1200 by coupling of a first coupler 1240 and a second coupler 1340. At this time, due to a coupling structure of the first coupler 1240 and the second coupler 1340, the main panel 1200 and the rear cover 1300 may come into close contact in the direction perpendicular to the surface of the display (first direction).

The rear cover 1300 may move in a direction parallel to the surface of the display (second direction) and be press-fit to the main panel 1200. That is, the rear cover 1300 may move in the second direction while in contact with the rear surface of the main panel 1200 and may be coupled to the main panel 1200.

The main panel 1200 and the rear cover 1300 may include the following components to perform the above-described fixing method.

FIG. 2 shows a perspective view of a rear surface of the main panel 1200. The main panel 1200 may include the first coupler 1240 and a third coupler 1250. The first coupler 1240 and the third coupler 1250 may each be provided in plural numbers. That is, the plurality of first couplers 1240 and the plurality of third couplers 1250 may be formed at appropriate positions of the main panel 1200.

As shown in FIG. 2, a direction perpendicular to the surface of the display may be defined as the first direction, and a direction horizontal to the surface of the display may be defined as the second direction. Therefore, the second direction is perpendicular to the first direction. In FIG. 2, the second direction indicates a right side of the display assembly 1000. However, in some embodiments, the second direction may be applied to a different direction. In an embodiment of components described below, a direction may be described based on the first direction and the second direction.

Referring to FIG. 1, the rear surface of the main panel 1200 faces the rear cover 1300 is in the first direction, and the front surface of the rear cover 1300 faces the main panel 1200 in the first direction.

FIGS. 3 to 6 are diagrams for explaining the first coupler 1240 of the main panel 1200.

Figure 3:
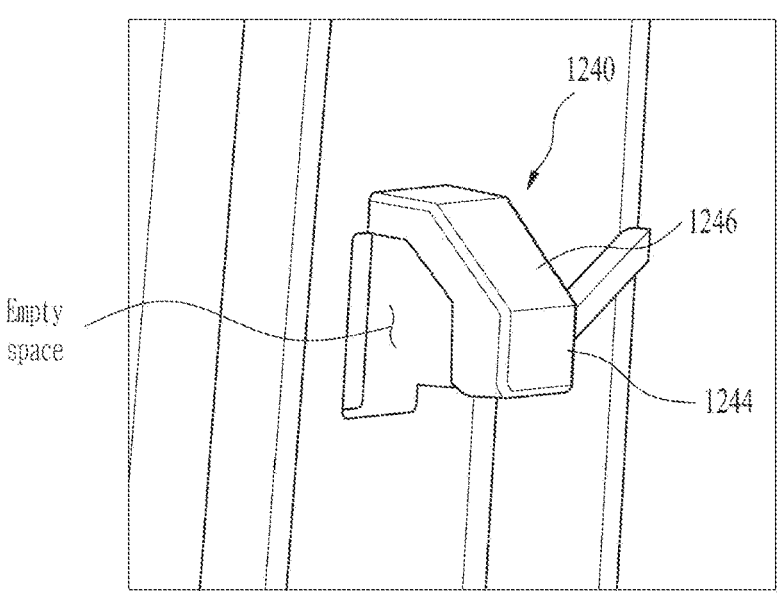
FIG. 3 is a perspective view showing a first coupler of a main panel.

FIG. 3 is a perspective view showing the first coupler 1240 of the main panel 1200.

Figure 4:
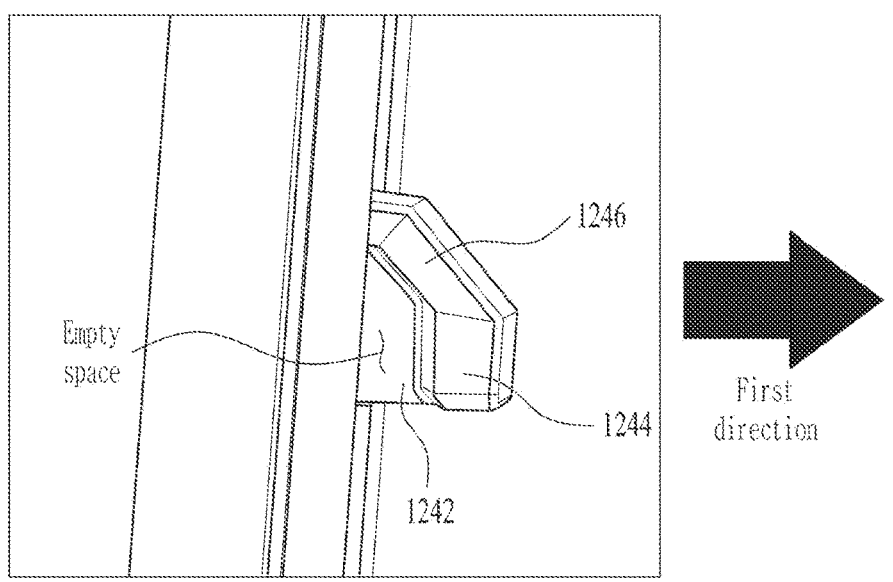
FIG. 4 shows a first side surface of a first coupler.

FIG. 4 shows a first side surface of the first coupler 1240.

Figure 5:
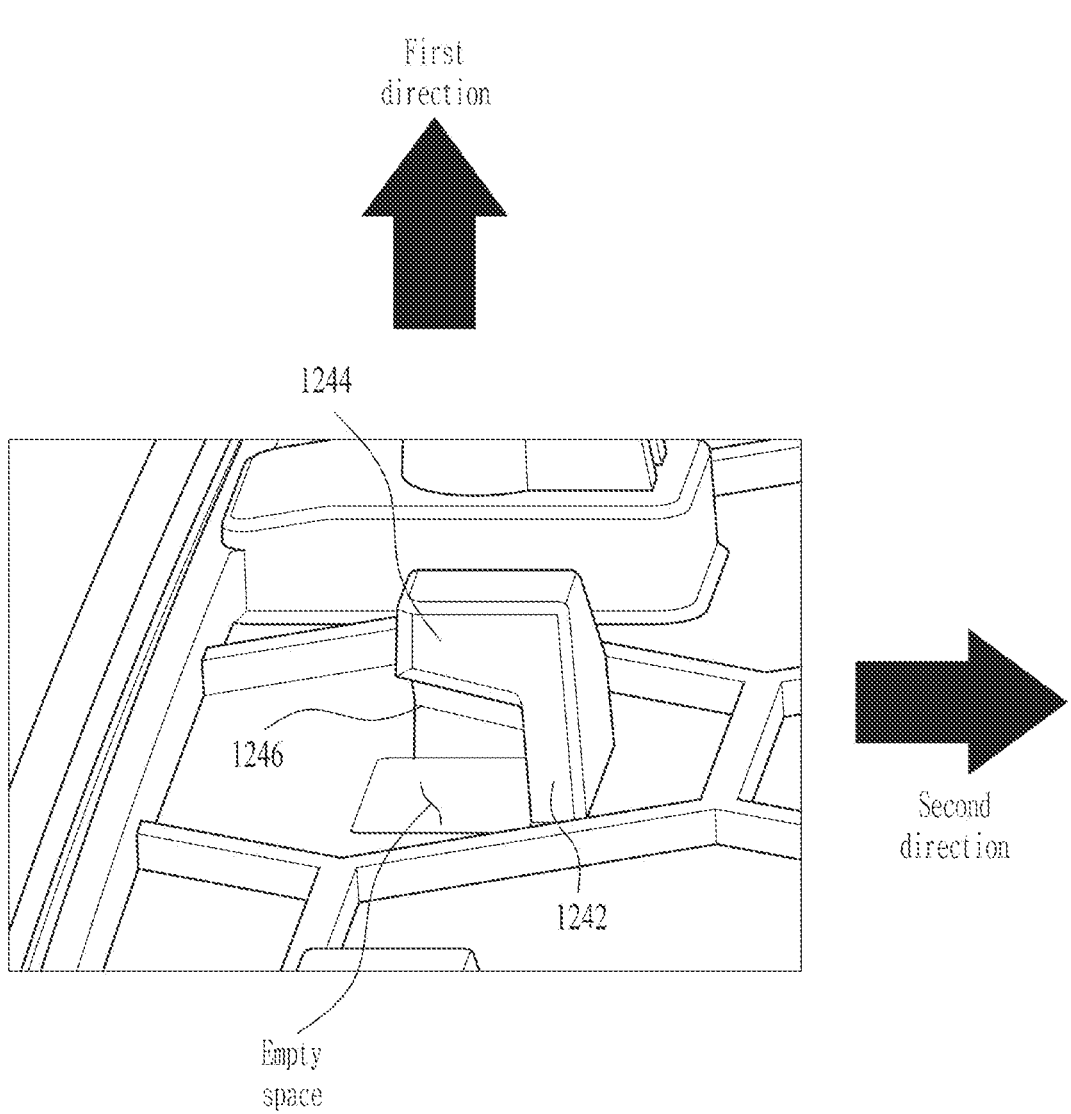
FIG. 5 shows a lower surface of a first coupler.

FIG. 5 shows a lower surface of the first coupler 1240.

Figure 6:
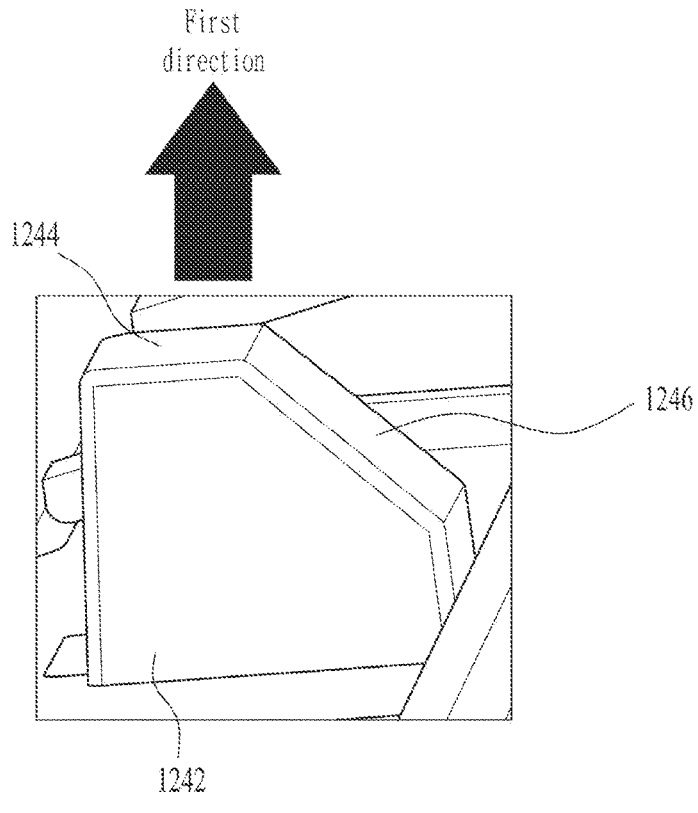
FIG. 6 shows a second side surface of a first coupler.

FIG. 6 shows a second side surface of the first coupler 1240. Here, the second side surface may represent a side surface viewed from an opposite direction of the first side surface.

Referring to FIGS. 3 to 6, the first coupler 1240 of the main panel 1200 will be explained. The first coupler 1240 may be provided in plural numbers at any location on the rear surface of the main panel 1200. The first coupler 1240 may include a first vertical protruding piece 1242 protruding in the first direction, and may include a first horizontal protruding piece 1244 protruding in the second direction at an end of the first vertical protruding piece 1242. At this time, the meaning of being in parallel to the second direction may indicate the same direction as the second direction shown in FIG. 2 or the same direction as the opposite direction.

The first coupler 1240 may have a horizontally taken cross-section shape similar to '¬' by the first vertical protruding piece 1242 and the first horizontal protruding piece 1244. Therefore, the first coupler 1240 may be engaged with the second coupler 1340 of the rear cover 1300 by the cross-sectional structure. The first horizontal protruding piece 1244 may extend in an upward direction of the main panel 1200 along an end edge of the first vertical protruding piece 1242. Accordingly, an internal empty space formed by the first coupler 1240 is blocked in an upward direction and the first directions by the first horizontal protruding piece 1244, and is blocked in the second direction by the first vertical protruding piece 1242. Therefore, the internal empty space of the first coupler 1240 is opened in a downward direction and in an opposite direction to the second direction.

In the above description, an upwardly extending portion of the first horizontal protruding piece 1244 may be referred to as an upper closed protruding piece 1246. An end of the upper closed protruding piece 1246 may be connected to an upper end of the first horizontal protruding piece 1244, and may extend upward to the rear surface of the main panel 1200 along an edge of the first vertical protruding piece 1242. A state in which the upper closed protruding piece 1246 extends may be expressed as shown in FIG. 6. Factors such as a direction and width in which the upper closed protruding piece 1246 extends may be changed depending on a protruding shape of the first vertical protruding piece 1242 or the protruding shape of the first horizontal protruding piece 1244.

Figure 7:
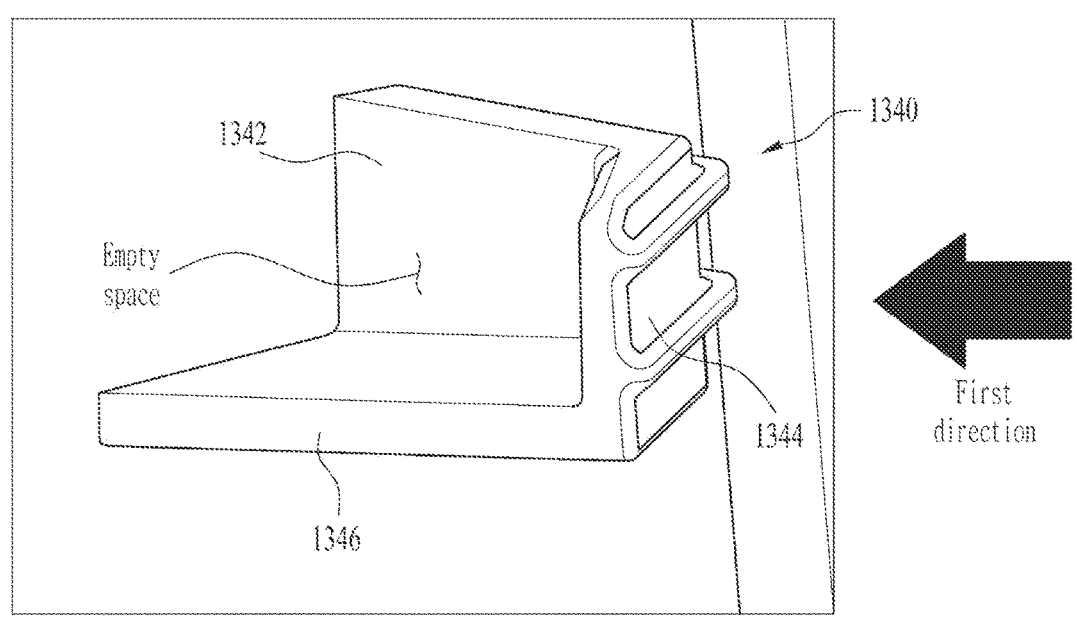
FIG. 7 is a perspective view showing a second coupler of a rear cover.

FIG. 7 is a perspective view showing the second coupler 1340 of the rear cover 1300.

Referring to FIG. 7, the rear cover 1300 includes the second coupler 1340. The second coupler 1340 is a component corresponding to and coupled to the first coupler 1240 of the main panel 1200. Thus, the position of the second coupler 1340 in the rear cover 1300 may correspond to the position of the first coupler 1240.

The second coupler 1340 includes a second vertical protruding piece 1342 protruding in the first direction from the rear cover 1300, and a second horizontal protruding piece 1344 protruding in the second direction at an end of the second vertical protruding piece 1342. A direction in which the first horizontal protruding piece 1244 of the first coupler 1240 protrudes and a direction in which the second horizontal protruding piece 1344 of the second coupler 1340 protrudes are in the second direction, but are opposite to each other. Therefore, the first coupler 1240 and the second coupler 1340 may be coupled to each other by engaging the first horizontal protruding piece 1244 and the second horizontal protruding piece 1344 with each other.

For example, the second horizontal protruding piece 1344 may be inserted into the internal empty space of the first coupler 1240 while moving in the second direction, and coupling therebetween may be strengthened by engagement with an inner surface of the first horizontal protruding piece 1244. Therefore, when the main panel 1200 and the rear cover 1300 are coupled, the rear cover 1300 moves in the first direction and comes into contact with the rear surface of the main panel 1200, and then the rear cover 1300 moves in the second direction, and the first coupler 1240 and the second coupler 1340 may be engaged with each other.

The second coupler 1340 may further include a lower closed protruding piece 1346. One end of the lower closed protruding piece 1346 may be connected to a lower end of the second horizontal protruding piece 1344 and may extend downward to the front surface of the rear cover 1300 along an edge of the second vertical protruding piece 1342. In this case, the front surface of the rear cover 1300 may refer to a surface facing the same direction as a direction in which a front surface of a display is directed. The lower closed protruding piece 1346 blocks a lower side of the internal empty space of the second coupler 1340. As a result, the internal empty space of the second coupler 1340 may be opened in an upward direction and the second direction.

Figure 8:
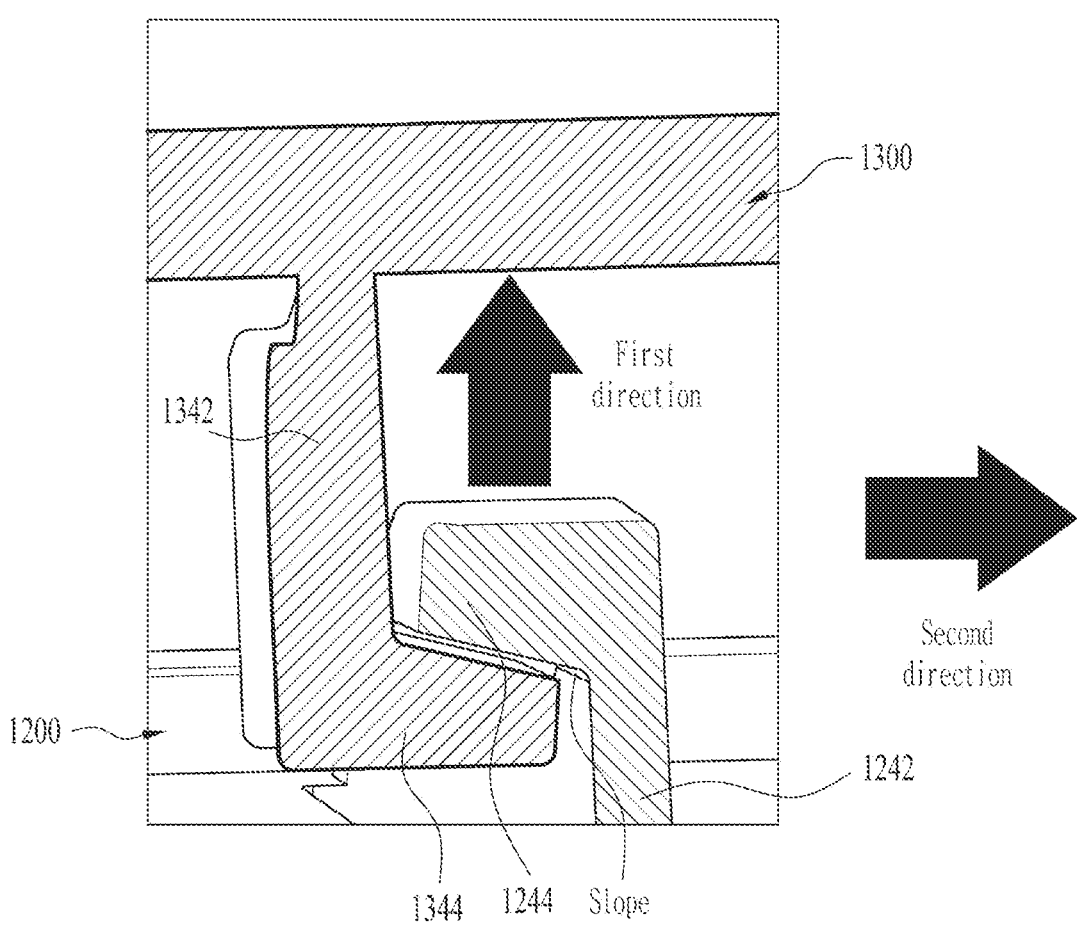
FIG. 8 is a cross-sectional view showing a state in which a first coupler and a second coupler are coupled to each other.

FIG. 8 is a cross-sectional view showing a state in which the first coupler 1240 and the second coupler 1340 are coupled to each other.

As seen from FIG. 8, the rear cover 1300 approaches the main panel 1200 in parallel with the first direction and then moves in the second direction, thereby engaging the first coupler 1240 and the second coupler 1340 with each other. In other words, the first horizontal protruding piece 1244 and the second horizontal protruding piece 1344 are engaged with each other, and inner surfaces thereof may rub against each other. A length by which the first horizontal protruding piece 1244 and the second horizontal protruding piece 1344 are engaged with each other may be set to 2.5 mm to 3 mm. When the first horizontal protruding piece 1244 and the second horizontal protruding piece 1344 move in parallel with the second direction to be engaged by a length of 2.5 mm to 3 mm, there needs to be no other interference that prevents the movement.

An inner surface of the first horizontal protruding piece 1244 and an inner surface of the second horizontal protruding piece 1344 may be formed as slopes. The slope of the first horizontal protruding piece 1244 and the slope of the second horizontal protruding piece 1344 may correspond to each other. The rear cover 1300 may move in the second direction to be guided by the slope and come into close contact with the main panel 1200. As the rear cover 1300 moves in the second direction, the rear cover 1300 may be guided by the slope and may come into closer contact with the main panel 1200.

When the rear cover 1300 moves in the second direction, a movement direction is guided by the upper closed protruding piece 1246 and the lower closed protruding piece 1346, enabling easy coupling.

Figure 9:
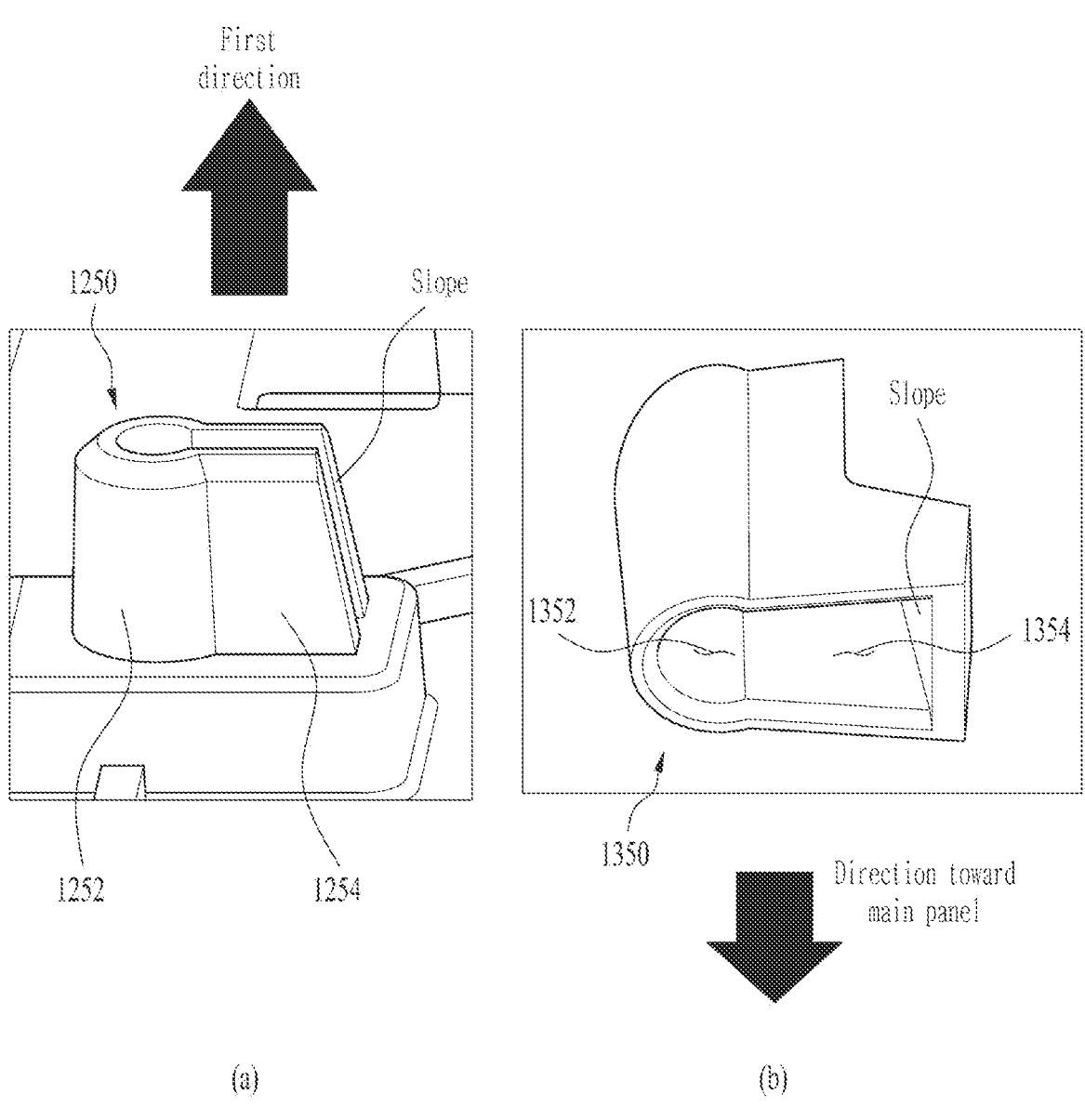
FIG. 9 shows a third coupler of a main panel and a fourth coupler of a rear cover.

FIG. 9 shows the third coupler 1250 of the main panel 1200 and a fourth coupler 1350 of the rear cover 1300.

Figure 10:
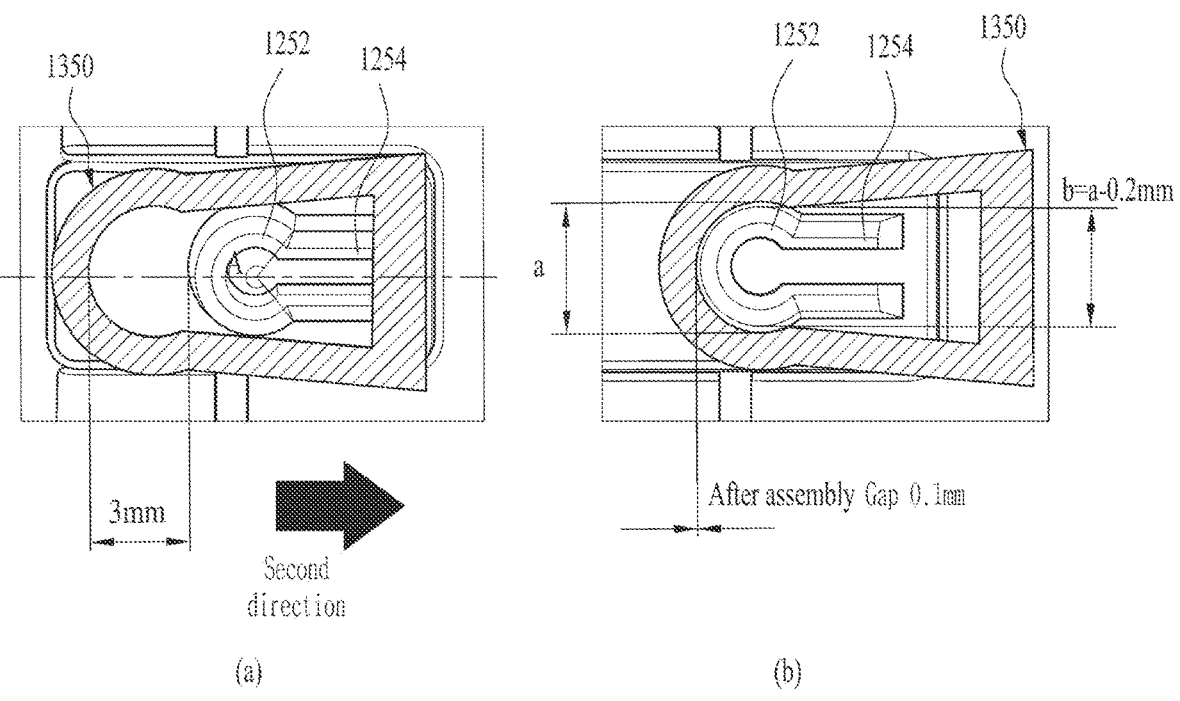
FIG. 10 is a diagram for explaining coupling between a third coupler and a fourth coupler.

FIG. 10 is a diagram for explaining coupling between the third coupler 1250 and the fourth coupler 1350.

Referring to FIGS. 9 to 10, the main panel 1200 includes the third coupler 1250, and the rear cover 1300 further includes the fourth coupler 1350 corresponding and coupled to the third coupler 1250.

Referring to figure (a) of FIG. 9, the third coupler 1250 protrudes in the first direction from the main panel 1200. A protruding shape of the third coupler 1250 is vertically symmetrical to each other and includes a head 1252 and an extension 1254. At this time, vertical symmetry may be based on a center line parallel to a horizontal plane in FIG. 10. As shown in figure (a) of FIG. 10, a shape of the third coupler 1250 may be symmetrical to each other based on an imaginary center line that passes through the center of the third coupler 1250 and is parallel to the second direction. Therefore, the shape of the third coupler 1250 is vertically symmetrical to each other.

The third coupler 1250 may include the head 1252 and the extension 1254 that extends from the head 1252.

A shape of an edge surface of the head 1252 may include a circular arc. That is, as shown in FIG. 10, the head 1252 may have an edge surface including a circular arc with a central angle A. As shown in FIG. 10, the circular arc may be shown as a circular arc generated via rotation by the central angle A on a central axis parallel to the first direction. In this case, the central angle A may be at least 180 degrees.

In another expression, the head 1252 may have an outer shape such as a fan-shaped cross section with the central angle A that protrudes in the first direction. At this time, the central angle A may be at least 180 degrees. The extension 1254 extends in the second direction from the head 1252. The extension 1254 may represent members extending in the second direction from both ends of the circular arc, respectively.

The fourth coupler 1350 includes an entry hole 1354 that entirely accommodates the third coupler 1250 and a head receiving portion 1352 that accommodates the head 1252. The entry hole 1354 and a head receiving portion 1352 are each a space that accommodates the third coupler 1250 and the accommodating space may be formed by a wall surrounding an edge.

The head receiving portion 1352 is formed as a space to which the head 1252 is to be press-fit, and the entry hole 1354 is formed as a space that the entire third coupler 1250 entirely enters. When the rear cover 1300 approaches the main panel 1200 in parallel with the first direction, the entire third coupler 1250 is entirely inserted into the entry hole 1354 of the fourth coupler 1350. As the rear cover 1300 moves in parallel with the second direction, the head 1252 of the third coupler 1250 is inserted into the head receiving portion 1352 of the fourth coupler 1350. That is, the spaces of the entry hole 1354 and the head receiving portion 1352 are connected to each other, and thus the head 1252 of the fourth coupler 1350 may move from the entry hole 1354 to the head receiving portion 1352.

A shape of the space of the head receiving portion 1352 may have an appropriate shape to accommodate the head 1252. According to an embodiment, referring to FIG. 10, the length of the head receiving portion 1352 in the second direction is 2.5 mm to 3 mm, and the maximum width of the head 1252 is a. A width of a connection portion between the head receiving portion 1352 and the entry hole 1354 is b. At this time, a difference between a and b may be 0.2 mm. That is, the width b of an inlet portion of the head receiving portion 1352 is 0.2 mm smaller than the maximum width a of the head 1252. Accordingly, the head 1252 may enter and be inserted into the head receiving portion 1352 while receiving a certain degree of frictional resistance. Even if an entrance width of the head receiving portion 1352 is slightly smaller than the width of the head 1252, the head 1252 may be press-fit due to the elasticity of the wall of the fourth coupler 1350.

The extension 1254 may include a slope at an edge. The slope formed on the extension 1254 may correspond to a slope of a wall of an edge of the entry hole 1354 of the fourth coupler 1350. Thus, when the rear cover 1300 approaches the main panel 1200 in the first direction, the third coupler 1250 may be guided by the slope and may be easily inserted into the entry hole 1354 in a process in which the third coupler 1250 enters the entry hole 1354. The extension 1254 may have a slope at a certain angle in the first direction at an end extending from both ends of the circular arc.

A height of the extension 1254 protruding in the first direction may be 5 mm or more, and a width of the extended member may be 1.2 mm or less. The head 1252 and the extension 1254 of the third coupler 1250, the edge wall of the fourth coupler 1350, and the like may be configured to have an appropriate protrusion height and wall width to have elasticity suitable for press-fitting. The materials of the main panel 1200 and the rear cover 1300 may also be considered.

Figure 11:
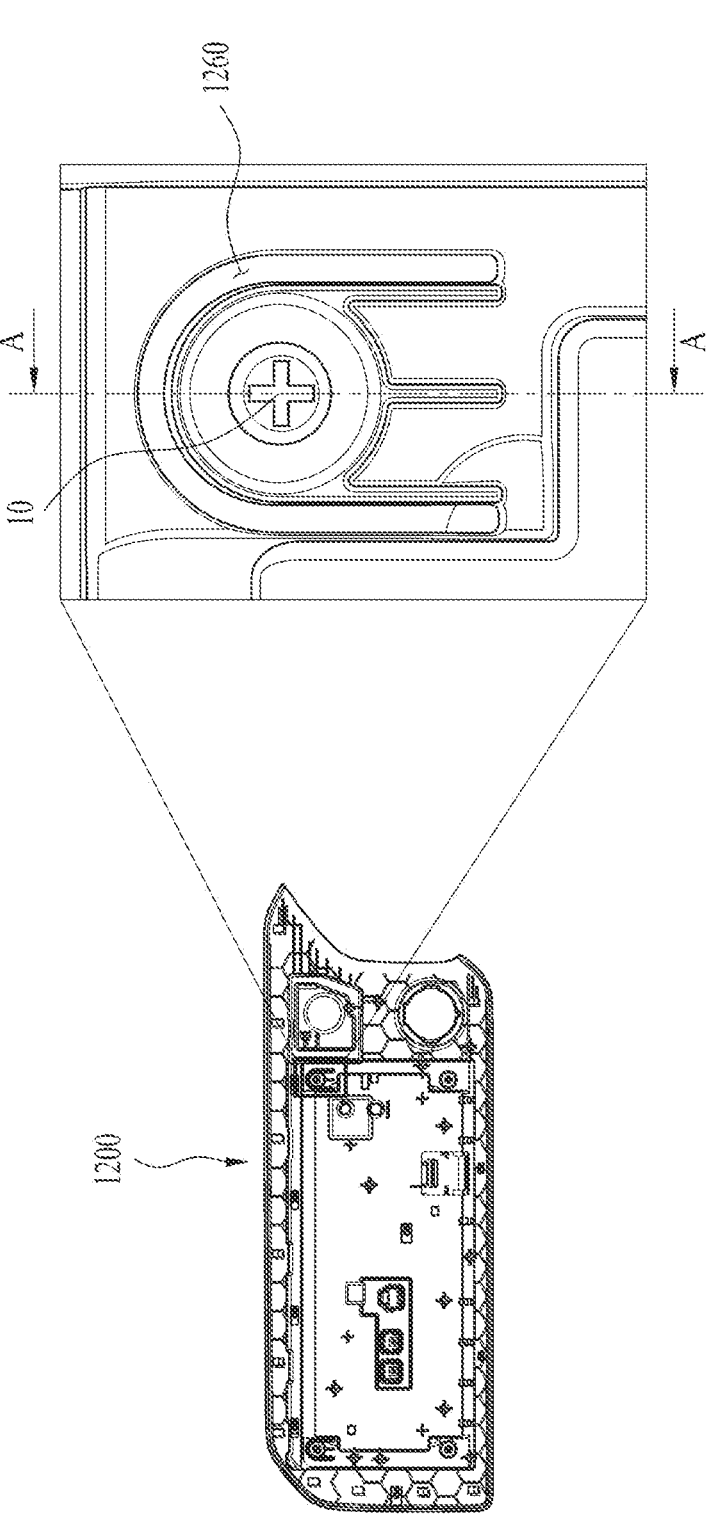
FIG. 11 shows a slit of a main panel.

FIG. 11 shows a slit 1260 of the main panel 1200.

The main panel 1200 may be fixed to the display unit 1100 using screw coupling. That is, a coupling force may act between the main panel 1200 and the display unit 1100 in the first direction by a torque of a screw. According to the related art, when screw coupling is applied to a plurality of positions, there is a risk that a difference in external force acting on the display unit occurs due to a difference in torque or a difference between the screws, and as a result, torsion acts on the display unit, causing the Mura phenomenon.

The main panel 1200 of the display assembly 1000 according to embodiments includes the slit 1260 formed through a peripheral part of a through hole of the screw 10. Accordingly, the flexibility of a portion to which the screw 10 is coupled may be ensured, and thus even if there is a torque difference or a step difference between screw couplings formed at a plurality of positions, an influence of external force on the display unit 1100 may be reduced. Therefore, a possibility of the Mura phenomenon occurring in the display is significantly reduced.

Figure 12:
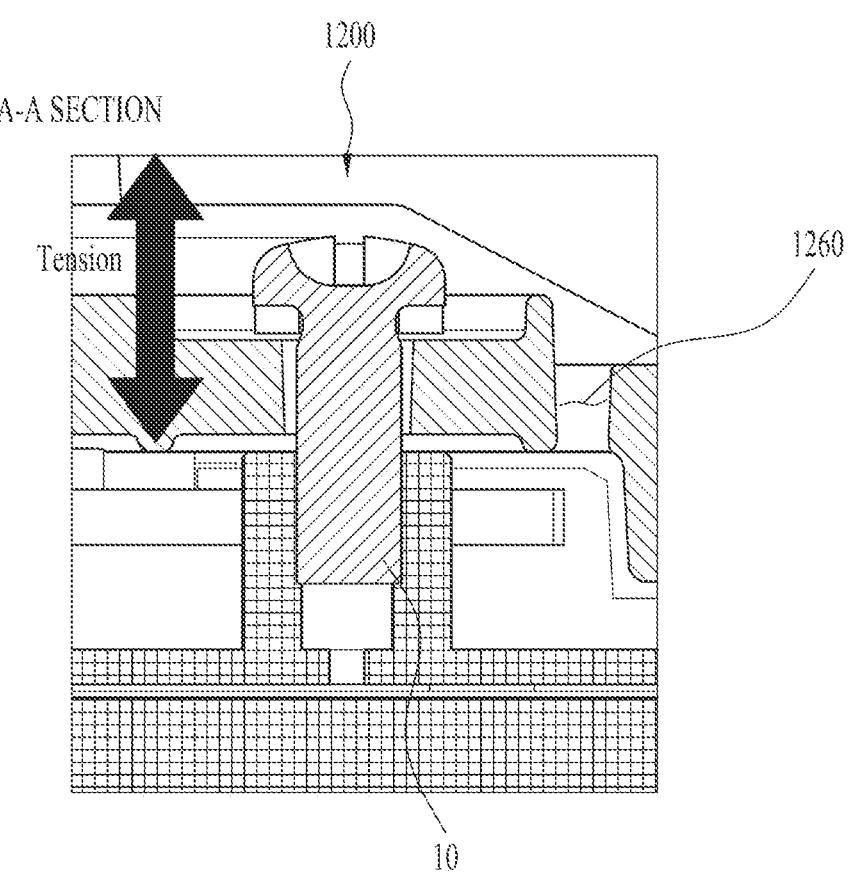
FIG. 12 shows a cross section of a portion of a main panel, in which a slit is formed.

FIG. 12 shows a cross section (A-A SECTION) of a portion of the main panel 1200, in which the slit 1260 is formed.

The screw 10 may be coupled to a hole formed in the rear surface of the display unit 1100 through the main panel 1200. In this case, the slit 1260 is formed through a peripheral part of the screw 10 in the main panel 1200, and thus flexibility of movement of the peripheral part of the screw 10 may be increased. That is, the peripheral part of the screw 10 is disconnected from other areas by the slit 1260, thereby increasing the flexibility of movement in the first direction. Therefore, when the screw 10 is coupled, even if an excessive torque difference or step difference occurs between the screws, the resulting external force is absorbed by the main panel 1200 and does not exert an excessive force on the display unit 1100.

The screw 10 according to an embodiment may be referred to as a name of another fastener such as a bolt, rivet, stud, or clip. Depending on a type of fastener used, the shape of the slit may be appropriately prepared.

The slit 1260 is formed through the main panel 1200 along the peripheral part of the through hole for screw coupling. The width of the slit 1260 may be 1 mm to 2 mm, in detail, 1.5 mm. The slit 1260 may be spaced at least a certain distance from the center of the through hole. At this time, the certain distance may be appropriately determined by a person skilled in the art.

The display assembly 1000 according to embodiments includes the first coupler 1240, the second coupler 1340, the third coupler 1250, and the fourth coupler 1350 for assembly of the main panel 1200 and the rear cover 1300, and further includes the slit 1260 formed on a peripheral part of a through hole of a screw.

According to another embodiment, the main panel 1200 may include the at least one first coupler 1240 and the at least one third coupler 1250. The rear cover 1300 may include the at least one second coupler 1340 at a position corresponding to the first coupler 1240 and the at least one fourth coupler 1350 at a position corresponding to the third coupler 1250.

According to another embodiment, a first coupler according to an embodiment may be formed on the rear cover, and a third coupler according to an embodiment may be formed on the rear cover. In this case, a second coupler and a fourth coupler that correspond to these, respectively, may be formed on the main panel.

According to another embodiment, when the main panel and the rear cover are connected by mutual screw coupling, a slit may be formed around the through hole of the screw of the rear cover. The main panel and the rear cover may be screwed together by a plurality of screws, and the number of screw couplings may be appropriately determined by a person skilled in the art.

In other words, various modifications are possible to the technical spirit described in embodiments of the present disclosure.

Hereinafter, the assembly method of the display assembly 1000 according to embodiments of the present disclosure will be described.

The rear cover 1300 is positioned in close contact with the main panel 1200 in a direction perpendicular to the surface of the display (first direction). At this time, the third coupler 1250 of the main panel 1200 is inserted into the entry hole 1354 of the fourth coupler 1350 of the rear cover 1300.

The rear cover 1300 moves in a direction parallel to the surface of the display (second direction) and press-fit with the main panel 1200. Here, the head 1252 of the third coupler 1250 is inserted into the head receiving portion 1352 of the fourth coupler 1350. Therefore, the main panel 1200 and the rear cover 1300 are coupled in the second direction.

Then, the rear cover 1300 and the main panel 1200 are screwed together. The screw coupling may couple the rear cover 1300 and the main panel 1200 in the first direction.

According to the above-described assembly method, the display assembly 1000 is assembled by a coupling force in two axial directions. Because the display assembly 1000 is assembled using a coupling force in the first and second directions, coupling characteristics are improved. A hook method is not used, and thus there is less risk of scratches on the display exterior due to a hook, and there is no need to apply an excessive external force to release hook coupling. Therefore, when a defective product occurs, it is easy to replace the product with a non-defective product.

According to embodiments of the present disclosure, a display assembly that minimizes external or internal forces induced on the display may be assembled. Accordingly, a possibility of Mura occurring in the display is significantly reduced, and the quality of the display may be improved.

According to embodiments of the present disclosure, an existing structure may be easily applied without being significantly modified, and may lead to high quality improvement results.

According to embodiments of the present disclosure, the rear cover may be easily disassembled and reassembled, making it easy to replace in case of defective products, and there is a low possibility of external damage occurring in the process.

The effects that are achievable by the present disclosure are not limited to what has been particularly described hereinabove and other advantages not described herein will be more clearly understood by persons skilled in the art from the following description.

As described above, the detailed description of the embodiments of the present disclosure has been given to enable those skilled in the art to implement and practice the disclosure. Although the disclosure has been described with reference to the embodiments, those skilled in the art will appreciate that various modifications and variations may be made in the present disclosure without departing from the spirit or scope of the disclosure and the appended claims. For example, those skilled in the art may use constructions disclosed in the above-described embodiments in combination with each other.

Therefore, the present disclosure intends not to limit the embodiments disclosed herein but to give a broadest range matching the principles and new features disclosed herein.

What is claimed is:

1. A display assembly comprising:

a display unit including a display and a rear surface, the display having a surface;

a main panel disposed on the rear surface of the display unit and having a rear surface; and a rear cover disposed on the rear surface of the main panel, wherein the main panel and the rear cover are configured such that the rear cover is coupled to the main panel by moving the rear cover on the rear surface of the main panel in a first direction perpendicular to the surface of the display and then in a second direction parallel to the surface of the display, wherein the main panel includes a first coupler comprising:

a first vertical protruding piece protruding in the first direction from the main panel; and a first horizontal protruding piece protruding in the second direction from an end of the first vertical protruding piece, wherein the rear cover includes a second coupler coupled to the first coupler and comprising:

a second vertical protruding piece protruding in the first direction from the rear cover; and a second horizontal protruding piece protruding in the second direction from an end of the second vertical protruding piece, wherein the first and second horizontal protruding pieces protrude respectively in mutually opposite directions, and the rear cover is moved in the second direction to have the first and second horizontal protruding pieces engage with each other, wherein the main panel further includes a third coupler having a vertically symmetrical shape and protruding in the first direction, the third coupler including a head and an extension extending from the head in the second direction, wherein an edge of the head includes a circular arc, and the extension extends from both ends of the circular arc, and wherein the rear cover includes a fourth coupler coupled to the third coupler.

2. The display assembly of claim 1, wherein:

the fourth coupler includes:

an entry hole disposed corresponding to the third coupler; and a head receiving portion disposed corresponding to the head, the entry hole of the fourth coupler has a space extending to the head receiving portion, and the third coupler has a portion disposed at the entry hole of the fourth coupler, and is configured to move in the second direction to press-fit the head to the head receiving portion.

3. The display assembly of claim 2, wherein:

an inner surface of the first horizontal protruding piece has a first slope, and an inner surface of the second horizontal protruding piece has a second slope corresponding to and in contact with the first slope of the first horizontal protruding piece.

4. The display assembly of claim 2, wherein:

an edge of the extension has a third slope; and an inner surface of the entry hole of the fourth coupler has a fourth slope corresponding to the third slope of the extension.

5. The display assembly of claim 1, wherein a central angle of the circular arc of the edge of the head is at least 180 degrees.

6. The display assembly of claim 5, wherein the main panel includes:

a through-hole configured for screw-coupling; and a slit extending through the main panel along a peripheral part of the through-hole, the slit being spaced apart from a center of the through-hole.

7. A display assembly comprising:

a display unit including a display and a rear surface, the display having a surface;

a main panel disposed on the rear surface of the display unit and having a rear surface; and a rear cover disposed on the rear surface of the main panel, wherein the main panel and the rear cover are configured such that the rear cover is coupled to the main panel by moving the rear cover on the rear surface of the main panel in a first direction perpendicular to the surface of the display and then in a second direction parallel to the surface of the display, wherein the main panel includes a first coupler, and the rear cover includes a second coupler coupled to the first coupler, wherein the first coupler has a vertically symmetrical shape and protruding in the first direction, wherein the first coupler includes a head and an extension extending from the head in the second direction, and wherein an edge of the head includes a circular arc, and the extension extends from both ends of the circular arc.

8. A method of assembling a display assembly including a display unit including a display and a rear surface, the display having a surface, a main panel disposed on the rear surface of the display assembly and having a rear surface, and rear cover, the method comprising:

moving the rear cover on the rear surface of the main panel in a first direction perpendicular to the surface of the display; and after moving the rear cover in the first direction, moving the rear cover in a second direction parallel to the surface of the display to press-fit the rear cover with the main panel, wherein the main panel includes a first coupler comprising:

a first vertical protruding piece protruding in the first direction from the main panel; and a first horizontal protruding piece protruding in the second direction from an end of the first vertical protruding piece, wherein the rear cover includes a second coupler coupled to the first coupler and comprising:

a second vertical protruding piece protruding in the first direction from the rear cover; and a second horizontal protruding piece protruding in the second direction from an end of the second vertical protruding piece, wherein the first and second horizontal protruding pieces protrude respectively in mutually opposite directions, and the rear cover is moved in the second direction to have the first and second horizontal protruding pieces engage with each other, wherein the main panel further includes a third coupler having a vertically symmetrical shape and protruding in the first direction, the third coupler including a head and an extension extending from the head in the second direction, wherein an edge of the head includes a circular arc, and the extension extends from both ends of the circular arc, and wherein the rear cover includes a fourth coupler coupled to the third coupler.

\* \* \* \* \*